(12) United States Patent
Kon

(10) Patent No.: US 9,926,422 B2
(45) Date of Patent: Mar. 27, 2018

(54) BUMP-FORMING MATERIAL, METHOD FOR PRODUCING ELECTRONIC COMPONENT, METHOD FOR PRODUCING SEMICONDUCTOR DEVICE, AND SEMICONDUCTOR DEVICE

(71) Applicant: FUJITSU LIMITED, Kawasaki-shi, Kanagawa (JP)

(72) Inventor: Junichi Kon, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/414,942

(22) Filed: Jan. 25, 2017

(65) Prior Publication Data

US 2017/0260348 A1 Sep. 14, 2017

(30) Foreign Application Priority Data

Mar. 9, 2016 (JP) ................. 2016-045839

(51) Int. Cl.
| | |
|---|---|
| *H01L 23/52* | (2006.01) |
| *C08J 9/00* | (2006.01) |
| *C08J 3/28* | (2006.01) |
| *C08J 9/14* | (2006.01) |
| *H01L 23/00* | (2006.01) |

(52) U.S. Cl.
CPC ........... *C08J 9/0061* (2013.01); *C08J 3/28* (2013.01); *C08J 9/143* (2013.01); *H01L 24/11* (2013.01); *H01L 24/16* (2013.01); *C08J 2325/18* (2013.01); *C08J 2363/04* (2013.01); *C08J 2433/02* (2013.01); *H01L 2224/16111* (2013.01); *H01L 2224/16501* (2013.01)

(58) Field of Classification Search
CPC ... H01L 24/11; H01L 24/16; C08J 3/28; C08J 9/0061; C08J 9/143
USPC ........................................... 257/737
See application file for complete search history.

(56) References Cited

U.S. PATENT DOCUMENTS

| | | | | |
|---|---|---|---|---|
| 8,076,782 B2* | 12/2011 | Asai | ......................... | G02B 6/43 257/621 |
| 8,585,753 B2* | 11/2013 | Scanlon | ................... | A61F 2/07 623/1.42 |
| 8,982,437 B2* | 3/2015 | Kuwahara | ................ | G02B 5/32 359/24 |
| 2006/0177966 A1 | 8/2006 | Shah | | |

FOREIGN PATENT DOCUMENTS

| | | |
|---|---|---|
| JP | H08-248561 | 9/1996 |
| JP | 2006-222422 A1 | 8/2006 |
| JP | 2008-060270 A1 | 3/2008 |
| JP | 2012-004436 A1 | 1/2012 |

* cited by examiner

*Primary Examiner* — Luan C Thai
(74) *Attorney, Agent, or Firm* — Kratz, Quintos & Hanson, LLP

(57) ABSTRACT

A material includes a base resin; a solvent; and a foaming agent and a photosensitizer, and/or a substance that serves as a foaming agent and a photosensitizer.

14 Claims, 3 Drawing Sheets

BUMP-FORMING MATERIAL, METHOD FOR PRODUCING ELECTRONIC COMPONENT, METHOD FOR PRODUCING SEMICONDUCTOR DEVICE, AND SEMICONDUCTOR DEVICE

CROSS-REFERENCE TO RELATED APPLICATION

This application is based upon and claims the benefit of priority of the prior Japanese Patent Application No. 2016-045839, filed on Mar. 9, 2016, the entire contents of which are incorporated herein by reference.

FIELD

The embodiments discussed herein are related to a bump-forming material for forming a fine bump on an electrode provided in, for example, a substrate, a wafer, or a chip, a method for producing an electronic component by using the bump-forming material, a method for producing a semiconductor device by using the bump-forming material, and a semiconductor device.

BACKGROUND

In recent years, the mounting density of electronic components on a substrate has increased. In the mounting of electronic components, facedown mounting for bonding electronic components via metal bumps tends to be widely employed.

Facedown mounting enables connection between electronic components with low resistance. When electrodes of an electronic component are arranged at a fine pitch, metal bumps may be accurately formed on the electrodes at a fine pitch. A facedown mounting method, as illustrated in FIG. 3A to FIG. 3D, typically involves pressing bumps against each other and heating the bumps (reflow process). In this method, an electronic component 100 (FIG. 3A) having bumps 102 formed on electrodes 101 is first prepared. Next, the bumps 102 of the electronic component 100 are pressed against each other (FIG. 3B). Next, the bumps 102 are bonded together by performing heating (FIG. 3C). However, in this method, the large diameter of the bumps in the reflow process has been a hindrance to the development of narrow pitches.

In general, electronic components having substrates made of different materials, such as a Si substrate, a compound semiconductor substrate, and an organic substrate, are bonded to each other. Because of this, electronic components tend to undergo deformation, such as warping, cracking, and disconnection, due to the stress associated with a difference in thermal expansion between substrates, which leads to a demand to increase the mechanical strength of an assembly. In order to reduce the stress between these different substrates, as illustrated in FIG. 3D, there is provided a method in which the vicinity of bumps is filled with an underfill agent 103 (organic resin material) after the reflow process (see Japanese Laid-open Patent Publication No. 2006-222422). However, this method has a problem in that it is difficult to pour a material because a narrow pitch results in a small gap between the bonded parts.

As a method for solving the above-mentioned problem in filling with an underfill agent after bonding (last-in method), there is an example in which an underfill agent is applied to the chip surface before bonding (first-in method) and a bonded part is filled with the underfill agent by way of expansion of the volume of the underfill agent by foaming or the like after bonding (see Japanese Laid-open Patent Publication No. 2012-4436). However, in this method, the bumps remain spherical, which hinders the development of fine fabrication.

SUMMARY

According to an aspect of the invention, a material includes a base resin; a solvent; and a foaming agent and a photosensitizer, and/or a substance that serves as a foaming agent and a photosensitizer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

<Bump-Forming Material>

Figure 1A:
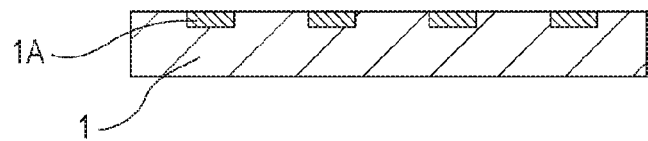
FIG. 1A is a schematic diagram for describing an example method for producing an electronic component disclosed herein (first process)

A bump-forming material disclosed herein contains a base resin and a solvent, and contains a foaming agent and a photosensitizer, and/or a substance that serves as a foaming agent and a photosensitizer, and may further contain other components as desired.

<Base Resin>

The base resin is not limited and can be appropriately selected in accordance with the purpose. Examples of the base resin include a phenolic resin, an epoxy resin, an acrylic resin, a melamine resin, a polyurethane resin, a polyimide resin, and a silicone resin. A copolymer of these may be used, or these may be used alone or in combination of two or more.

<Solvent>

The solvent is not limited and can be appropriately selected in accordance with the purpose. The solvent is preferably a solvent that can dissolve the components of the bump-forming material, can be dried at an appropriate drying rate, and allows a uniform, smooth coating film to form after the solvent is dried.

Examples of such a solvent include alcohol solvents, chain ester solvents, cyclic ester solvents, ketone solvents, chain ether solvents, cyclic ether solvents, and water.

Examples of the alcohol solvents include methanol, ethanol, propyl alcohol, isopropyl alcohol, and butyl alcohol. Examples of the chain ester solvents include ethyl lactate, ethyl cellosolve acetate, methyl cellosolve acetate, propylene glycol monomethyl ether acetate, and propylene glycol monoethyl ether acetate. Examples of the cyclic ester solvents include lactone solvents, such as γ-butyrolactone. Examples of the ketone solvents include acetone, methyl ethyl ketone, cyclohexanone, and heptanone. Examples of the chain ether solvents include ethyl cellosolve, methyl cellosolve, propylene glycol monomethyl ether, propylene glycol monoethyl ether, ethylene glycol dimethyl ether, and propylene glycol monopropyl ether. Examples of the cyclic ether solvents include tetrahydrofuran and dioxane. These solvents may be used alone or in combination of two or more.

The amount of the solvent in the bump-forming material is not limited and can be appropriately selected in accordance with the purpose.

<Photosensitizer>

The bump-forming material contains a photosensitizer in order to impart photosensitivity to a coating film formed by using the bump-forming material.

The photosensitizer has, for example, a function of generating an acid by light irradiation to increase the solubility of part of the coating film exposed to light irradiation in an alkaline aqueous solution. Examples of the photosensitizer include an o-quinone-diazide compound. An acid generator may be added as the photosensitizer and combined with a crosslinker described below, so that the bump-forming material can function as a negative resist.

The acid generator is not limited and can be appropriately selected in accordance with the purpose. Examples of the acid generator include iodonium salt compounds, sulfonium salt compounds, halogen compounds, sulfonate compounds such as triphenylsulfonium nonafluorobutanesulfonate, imide compounds, carbonyl compounds, disulfone compounds, α,α-bisallyl sulfonyl diazomethane compounds, and diazonium salt compounds.

Specific examples of the iodonium salt compounds include the compounds represented by the following structural formulas.

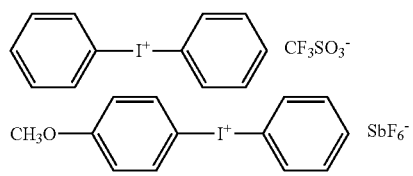

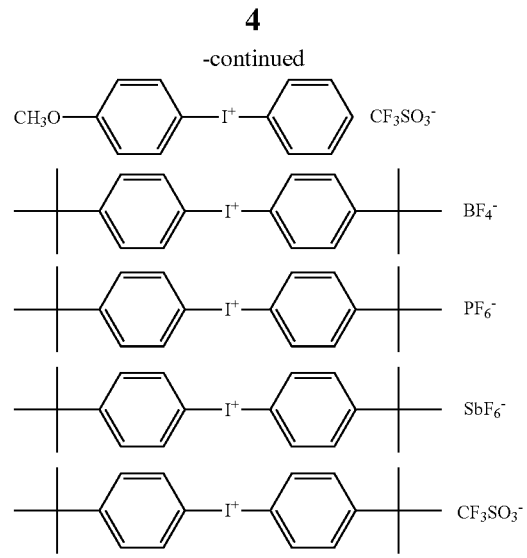

Specific examples of the sulfonium salt compounds include the compounds represented by the following structural formulas.

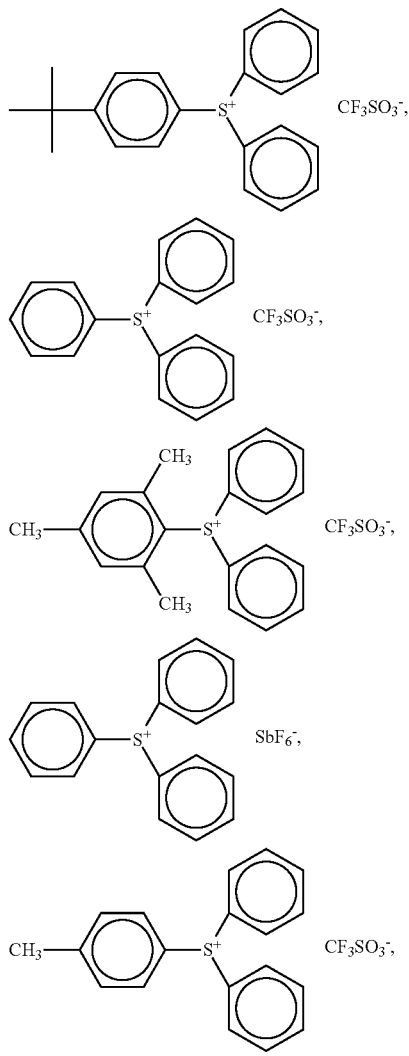

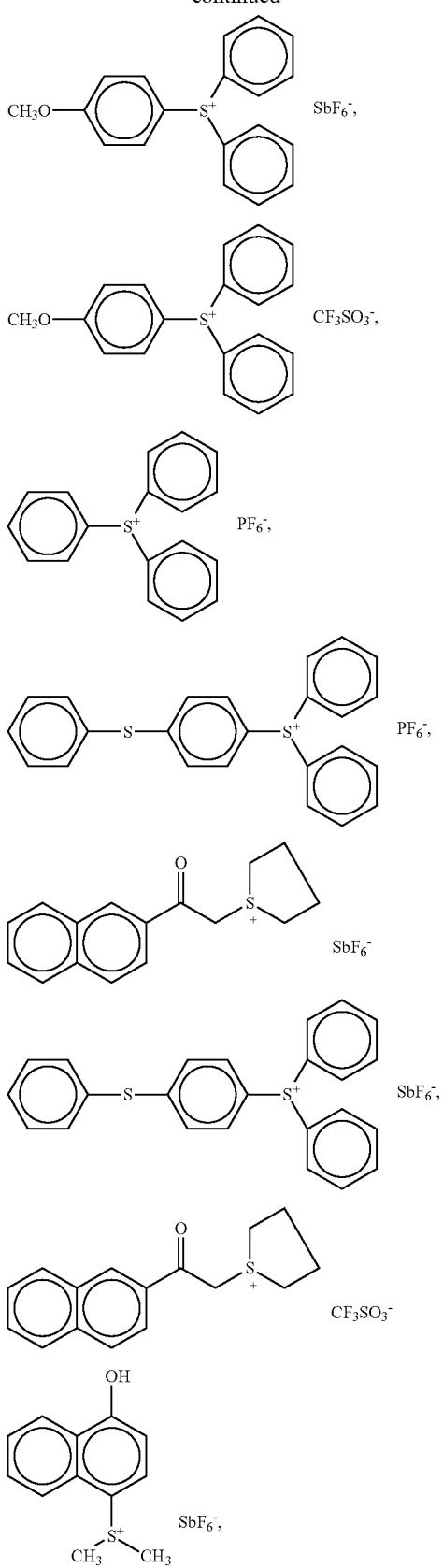
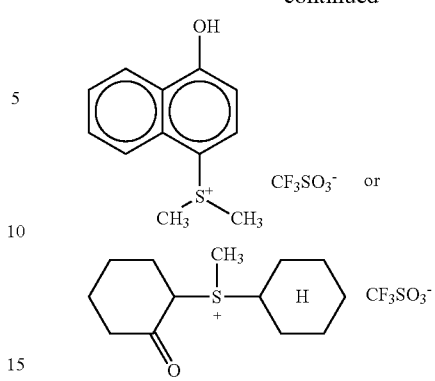
Specific examples of the halogen compounds include the compounds represented by the following structural formulas.
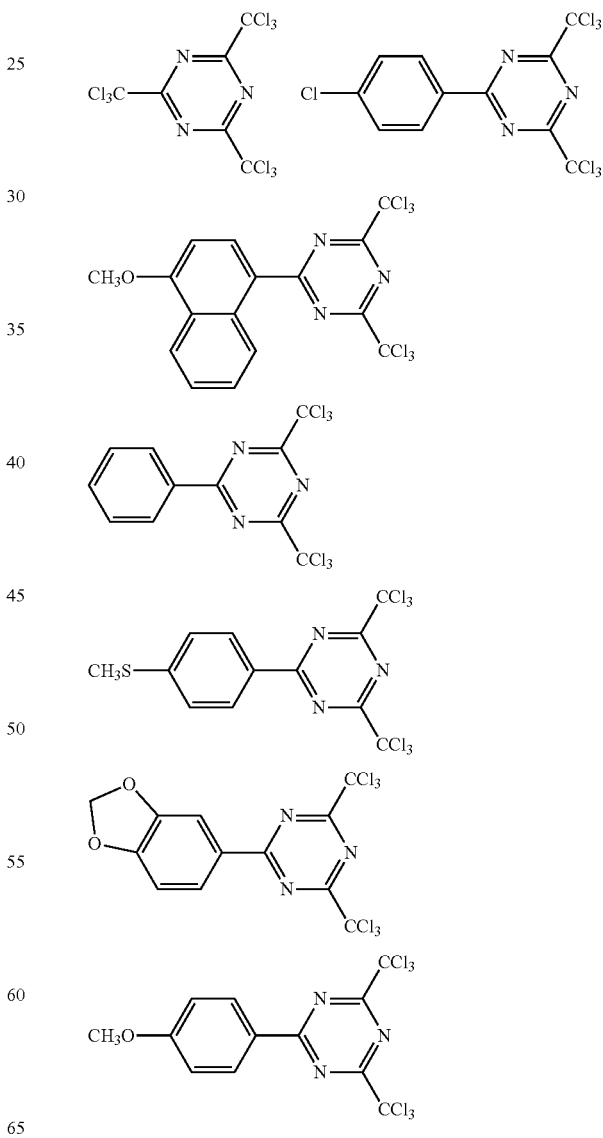

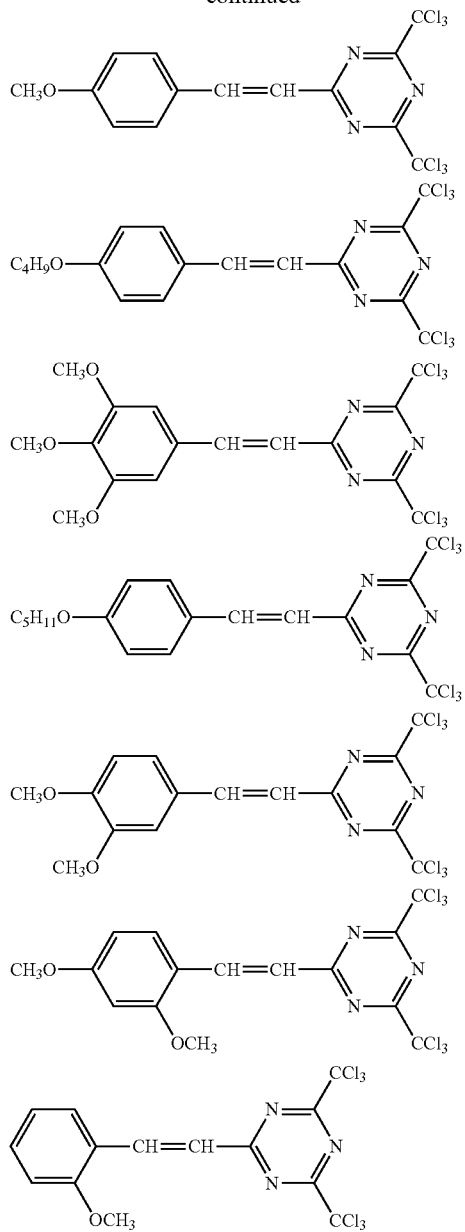
Specific examples of the sulfonate compounds include the compounds represented by the following structural formulas.
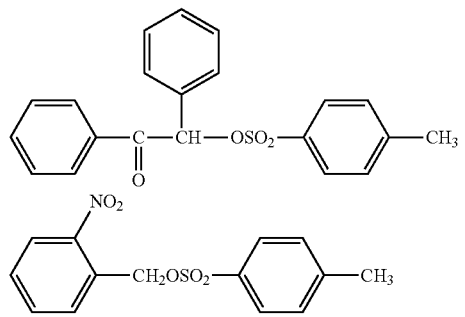
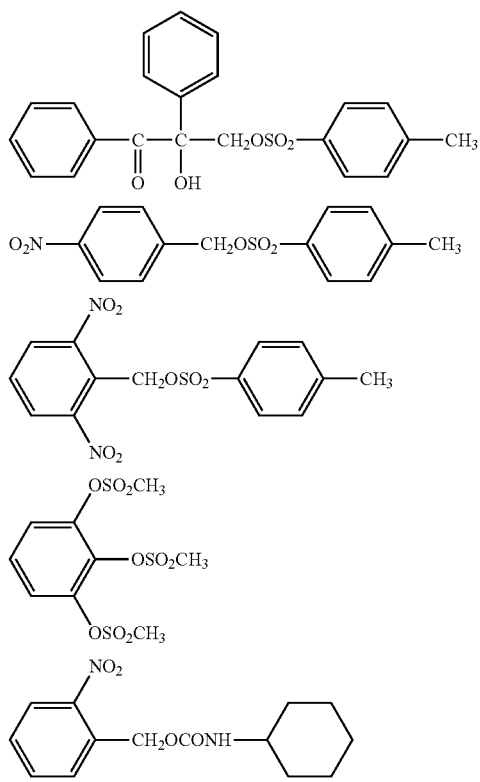
Specific examples of the imide compounds include the compounds represented by the following structural formulas.
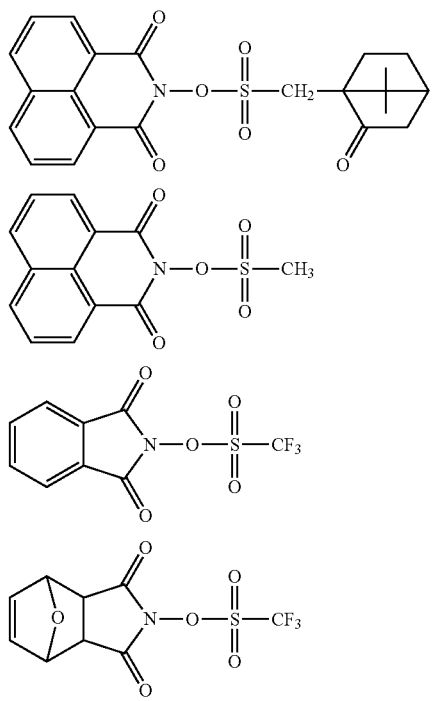

-continued

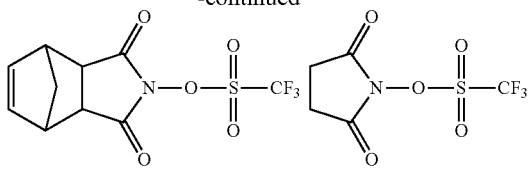

Specific examples of the carbonyl compounds include the compounds represented by the following structural formulas.

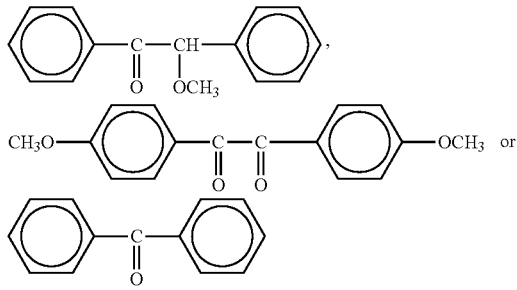

Specific examples of the disulfone compounds include the compounds represented by the following structural formulas.

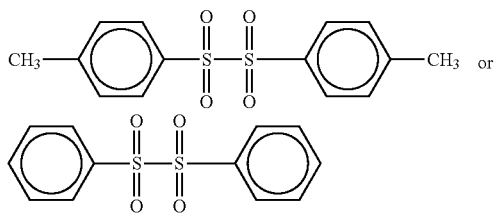

Specific examples of the α,α-bisallyl sulfonyl diazomethane compounds include the compounds represented by the following structural formulas.

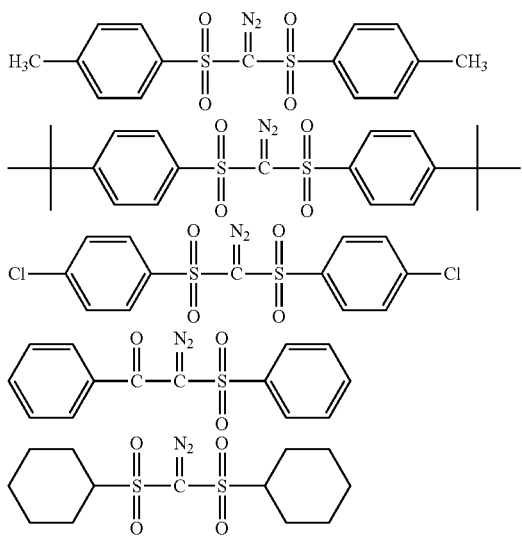

-continued

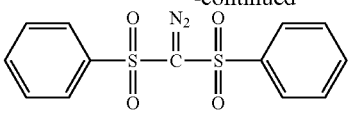

Specific examples of the diazonium salt compounds include the compounds represented by the following structural formulas.

The amount of the photosensitizer in the bump-forming material is not limited and can be appropriately selected in accordance with the purpose. The amount of the photosensitizer is preferably 0.5 parts by mass to 30 parts by mass with respect to 100 parts by mass of the base resin. When the amount of the photosensitizer is less than 0.5 parts by mass, the crosslinking reaction of the base resin may not proceed well. When the amount of the photosensitizer is more than 30 parts by mass, the crosslinking reaction may reach the unexposed part.

<Foaming Agent>

The foaming agent is any foaming agent that causes a coating film formed from the bump-forming material to be made into a porous film, and the foaming agent can be appropriately selected in accordance with the purpose. The foaming agent is preferably decomposed or evaporated by performing heating at a temperature of 400° C. or lower or performing irradiation with infrared rays. Examples of the foaming agent include cellulose-based resins, polyimide-based resins, polyester-based resins, acrylic-based resins, and polyether-based resins, polyolefin-based resins, polyol-based resins, polystyrene-based resins, epoxy-based resins, phenolic compounds, imidazole compounds, adamantane compounds, diaryliodonium salts, triarylsulfonium salts, triarylselenonium salts, and various photoacid generators and thermal acid generators described in Japanese Laid-open Patent Publication No. 8-248561.

The foaming agents listed above include substances that serve as a foaming agent and a photosensitizer. When the foaming agent is a resin, the molecular weight is preferably about 10 to 100,000 in order to form pores having a diameter of 100 nm or less in forming the coating film.

Here, the molecular weight refers to a weight-average molecular weight. From the viewpoints of decomposition and evaporation with heat or ionizing radiation, acrylic-based resins and polystyrene-based resins are more preferred among the above-mentioned resins.

When ionizing radiation is used to decompose the foaming agent, diaryliodonium salts, triarylsulfonium salts, triarylselenonium salts, and the like are particularly preferred because these salts and the like exhibit relatively high quantum yield with respect to irradiating radiation and are released as gas from the film after decomposed.

When the foaming agent is a decomposable substance, the size of pores in the coating film can be freely changed by adjusting the molecular size of the substance, and addition of various decomposable substances having a different decomposition temperature or decomposition wavelength can cause pores having a different size to form in the coating film.

An advantage of this is that a decomposable substance having a small molecular size is first decomposed and released to form fine pores, which can facilitate a subsequent release of a decomposable substance having a large molecular size and efficiently produce many pores.

The amount of the foaming agent in the bump-forming material is not limited and can be appropriately selected in accordance with the purpose. The amount of the foaming agent is preferably 0.1 parts by mass to 200 parts by mass with respect to 100 parts by mass of the base resin.

When the amount of the foaming agent is less than 0.1 parts by mass, it is difficult to obtain an effect of forming many pores (expanding the volume). When the amount of the foaming agent is more than 200 parts by mass, the film may have low strength.

<Other Components>

Other components are not limited unless the advantageous effects of the embodiments are impaired, and can be appropriately selected in accordance with the purpose. Examples of other components include publicly known various additives. For example, a surfactant and the like can be added in order to improve the solubility and coating properties of various components. In addition, the bump-forming material may contain a crosslinker, a reducing agent, and the like.

<Surfactant>

The surfactant is not limited and can be appropriately selected in accordance with the purpose. Examples of the surfactant include nonionic surfactants, cationic surfactants, anionic surfactants, and amphoteric surfactants.

These surfactants may be used alone or in combination of two or more. Of these, nonionic surfactants are preferred because they are free of metal ions. Suitable examples of the nonionic surfactants include alkoxylate surfactants, fatty acid ester surfactants, amide surfactants, alcohol surfactants, and ethylenediamine surfactants.

Specific examples of suitable nonionic surfactants include polyoxyethylene-polyoxypropylene condensate compounds, polyoxyalkylene alkyl ether compounds, polyoxyethylene alkyl ether compounds, polyoxyethylene derivative compounds, sorbitan fatty acid ester compounds, glycerol fatty acid ester compounds, primary alcohol ethoxylate compounds, phenol ethoxylate compounds, nonylphenol ethoxylates, octylphenol ethoxylates, lauryl alcohol ethoxylates, oleyl alcohol ethoxylates, fatty acid esters, amides, natural alcohols, ethylenediamines, and secondary alcohol ethoxylates.

The cationic surfactant is not limited and can be appropriately selected in accordance with the purpose. Examples of the cationic surfactant include alkyl cationic surfactants, amide quaternary cationic surfactants, and ester quaternary cationic surfactants.

The amphoteric surfactant is not limited and can be appropriately selected in accordance with the purpose. Examples of the amphoteric surfactant include amine oxide surfactants and betaine surfactants.

The amount of the surfactant in the bump-forming material can be appropriately adjusted depending on the type and amount of each component.

<Crosslinker>

A crosslinker may be added to the bump-forming material in order for the bump-forming material to function as a negative resist and in order to cause a crosslinking reaction of the base resin after heat foaming to form a firm coating film.

The crosslinker is any crosslinker that has a function of causing a crosslinking reaction of the base resin, and the crosslinker can be appropriately selected in accordance with the purpose. Examples of the crosslinker include amino crosslinkers.

Suitable examples of the amino crosslinkers include urea derivatives, melamine derivatives, and uril derivatives. These crosslinkers may be used alone or in combination of two or more.

Examples of the urea derivatives include urea, alkoxymethylene urea, N-alkoxymethylene urea, ethylene urea, ethylene urea carboxylic acid, and derivatives thereof.

Examples of the melamine derivatives include alkoxy methyl melamine and derivatives thereof. Examples of the uril derivatives include benzoguanamine, glycoluril, and derivatives thereof.

The amount of the crosslinker in the bump-forming material is preferably 0.5 parts by mass to 50 parts by mass and more preferably 1 part by mass to 40 parts by mass with respect to 100 parts by mass of the base resin.

When the amount of the crosslinker is less than 0.5 parts by mass, the crosslinking reaction of the base resin may not proceed well. When the amount of the crosslinker is more than 50 parts by mass, the crosslinking reaction may reach the unexposed part.

<Reducing Agent>

A reducing agent may be added to the bump-forming material in order to reduce bump oxidation. Examples of the reducing agent include reducing agents having a carboxyl group and aldehyde compounds.

The reducing agent is any type of material that has a reducing action. Examples of suitable reducing agents include acrylic acid, methacrylic acid, oxalic acid, and formic acid.

The amount of the reducing agent in the bump-forming material is not limited and can be appropriately selected in accordance with the purpose. The amount of the reducing agent is preferably 0.1 parts by mass to 40 parts by mass with respect to 100 parts by mass of the base resin. When the amount of the reducing agent is less than 0.1 parts by mass, the reducing agent may fail to spread into the film well, that is, may not function appropriately as a reducing agent. When the amount of the reducing agent is more than 40 parts by mass, the reducing agent may affect the reaction between the base resin and the crosslinker.

<Method for Producing Electronic Component>

A method for producing an electronic component disclosed herein includes a process of forming a bump-forming pattern and a process of forming bumps and may further include other processes as desired.

<Process of Forming Bump-Forming Pattern>

The process of forming a bump-forming pattern is any process involving forming a bump-forming pattern having openings on a substrate by using a bump-forming material. The process can be appropriately selected in accordance with the purpose. For example, there is a method in which the bump-forming material is applied to the substrate and openings are formed in a coating film made of the bump-forming material by a photolithography method to form a bump-forming pattern.

The bump-forming material is the bump-forming material disclosed herein. The substrate is any substrate having an electrode and can be appropriately selected in accordance with the purpose. Examples of the substrate include a ceramic substrate, a glass epoxy substrate, a chip component, and a semiconductor component.

The application method is not limited and can be appropriately selected in accordance with the purpose. Examples of the application method include a dip coating method, a spin coating method, a spray coating method, a steam coating method, various printing methods, and a doctor blade method.

The photolithography method may be of a positive type or a negative type.

The exposure light used for patterning in the photolithography method is not limited and can be appropriately selected in accordance with the purpose. Examples of suitable exposure light include active energy rays, such as ultraviolet rays, X rays, an electron beam, an excimer laser beam, and a converged ion beam.

The developer used for developing after exposure is not limited and can be appropriately selected in accordance with the purpose. Water or an alkaline aqueous solution is particularly suitable, and these can reduce the load on the environment.

Examples of alkalis include inorganic alkalis, such as sodium hydroxide, potassium hydroxide, sodium silicate, and ammonia; primary amines, such as ethylamine and propylamine; secondary amines, such as diethylamine and dipropylamine; tertiary amines, such as trimethylamine and triethylamine; alcohol amines, such as diethylethanolamine and triethanolamine; and quaternary ammonium hydroxides, such as tetramethylammonium hydroxide, tetraethylammonium hydroxide, triethyl hydroxymethyl ammonium hydroxide, and trimethyl hydroxyethyl ammonium.

As desired, the alkaline aqueous solution may contain water-soluble organic solvents, such as methyl alcohol, ethyl alcohol, propyl alcohol, and ethylene glycol; a surfactant; and a resin dissolution inhibitor.

<Process of Forming Bumps>

The process of forming bumps is any bump forming process involving filling the openings of the bump-forming pattern with a bump metal. The process can be appropriately selected in accordance with the purpose.

The bump metal is any metal for forming bumps and can be appropriately selected in accordance with the purpose. The bump metal preferably includes, for example, at least one of tin and indium or any combination thereof.

The method for filling the openings with the bump metal is not limited and can be appropriately selected in accordance with the purpose. The method for producing an electronic component will be described by using the drawings.

Figure 1B:
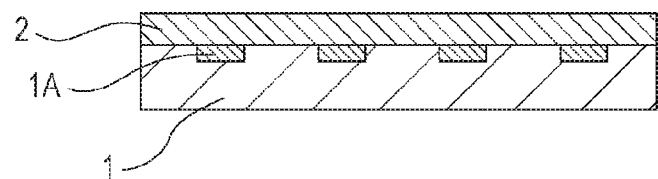
FIG. 1B is a schematic diagram for describing the example method for producing an electronic component disclosed herein (second process)
Figure 1C:
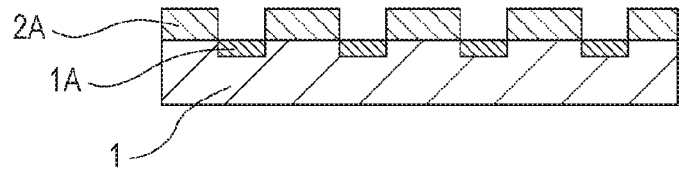
FIG. 1C is a schematic diagram for describing the example method for producing an electronic component disclosed herein (third process)

FIG. 1A to FIG. 1D are schematic diagrams for describing the method for producing an electronic component. First, a substrate 1 having electrodes 1A is provided (FIG. 1A). Next, a bump-forming material is applied to the surface of the substrate 1 on the electrode 1A side to form a coating film 2 (FIG. 1B). Next, a bump-forming pattern 2A is obtained by forming openings in the coating film 2 so as to expose the electrodes 1A by a photolithography method (FIG. 1C).

Figure 1D:
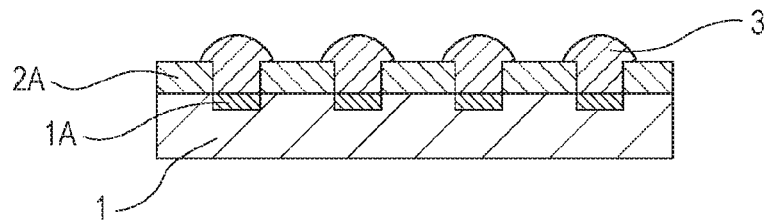
FIG. 1D is a schematic diagram for describing the example method for producing an electronic component disclosed herein (fourth process)

Next, the openings are filled with the bump metal to form bumps 3 on the substrate 1, and an electronic component is obtained accordingly (FIG. 1D).

The bump-forming pattern is a fine pattern because it is formed by, for example, a photolithography method. Since the method for producing an electronic component involves filling the openings of the fine pattern with the bump metal to form the bumps, a fine bump pattern can be obtained.

<Method for Forming Semiconductor Device>

The method for producing a semiconductor device disclosed herein includes at least a process of forming a bump-forming pattern, a process of forming bumps, a pressing process, or a heating process, and may further include other processes as desired.

<Process of Forming Bump-Forming Pattern>

The process of forming a bump-forming pattern is the same as the process of forming a bump-forming pattern in the method for producing an electronic component.

<Process of Forming Bumps>

The process of forming bumps is any process involving filling the openings of the bump-forming pattern with a bump metal to produce a substrate having bumps. The process can be appropriately selected in accordance with the purpose. The process of forming bumps is the same as the process for forming bumps in the method for producing an electronic component.

<Pressing Process>

The pressing process is any process involving pressing two substrates thus produced against each other with the bumps on one substrate facing the corresponding bumps on the other substrate, and the pressing process can be appropriately selected in accordance with the purpose.

The temperature and the time in pressing are not limited and can be appropriately selected in accordance with the purpose.

<Heating Process>

The heating process is any process of performing heating after pressing and can be appropriately selected in accordance with the purpose. In the heating process, the bumps on one substrate are bonded to and integrated with the corresponding bumps on the other substrate, and many pores are formed in the bump-forming pattern made of the bump-forming material. Many pores are formed by the foaming agent contained in the bump-forming material.

<Semiconductor Device>

A semiconductor device disclosed herein includes a first substrate, a second substrate, and a porous film, and may further include other members as desired. In the semiconductor device, the second substrate is bonded to the first substrate via a bonded part in which two bumps are bonded to each other.

In the semiconductor device, the porous film is interposed between the first substrate and the second substrate. The porous film contains a decomposition residue derived from a photosensitizer. The semiconductor device can be obtained by the method for producing a semiconductor device. That is, the porous film is a film obtained by forming many pores in the bump-forming pattern formed from the bump-forming material.

Figure 2A:
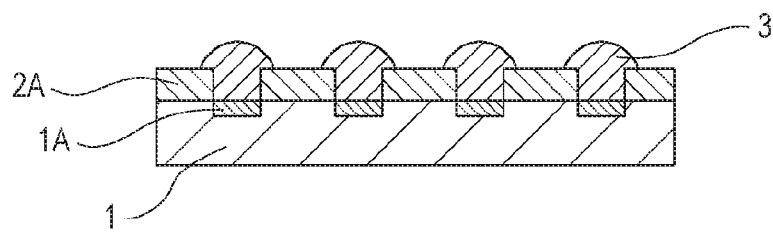
FIG. 2A is a schematic diagram for describing an example method for producing a semiconductor device disclosed herein (first process)
Figure 2B:
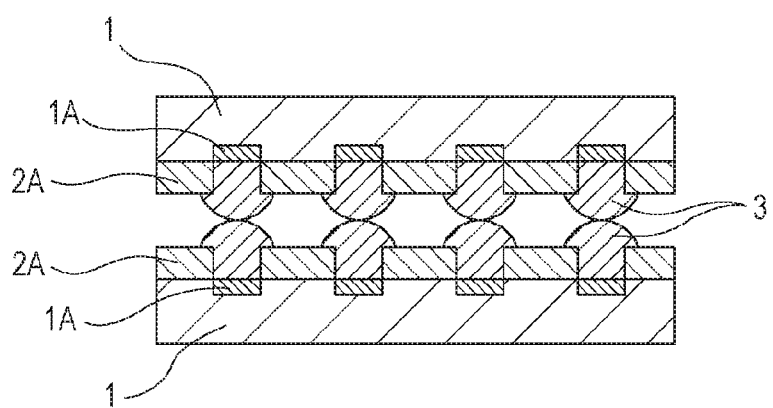
FIG. 2B is a schematic diagram for describing the example method for producing a semiconductor device disclosed herein (second process)
Figure 2C:
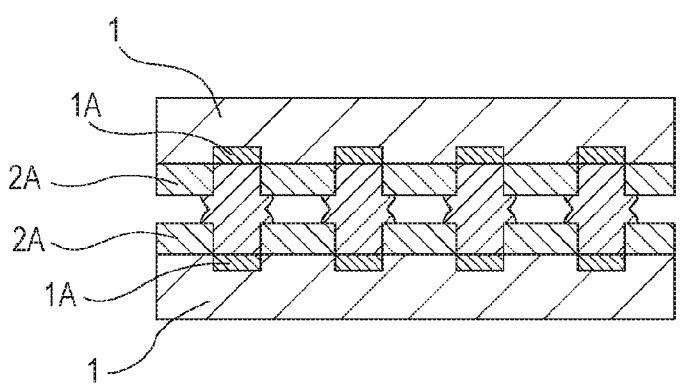
FIG. 2C is a schematic diagram for describing the example method for producing a semiconductor device disclosed herein (third process)
Figure 2D:
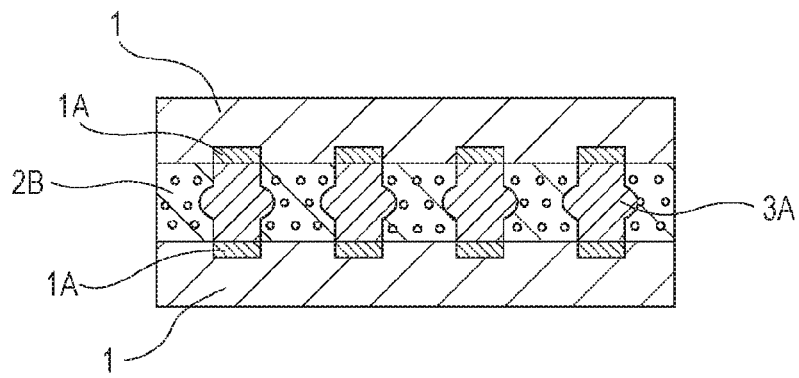
FIG. 2D is a schematic diagram for describing the example method for producing a semiconductor device disclosed herein (fourth process)
Figure 3A:
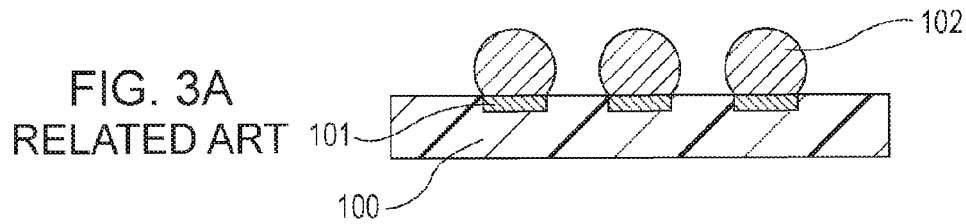
FIG. 3A is a schematic diagram for describing a bonding method known in the art (first process)
Figure 3B:
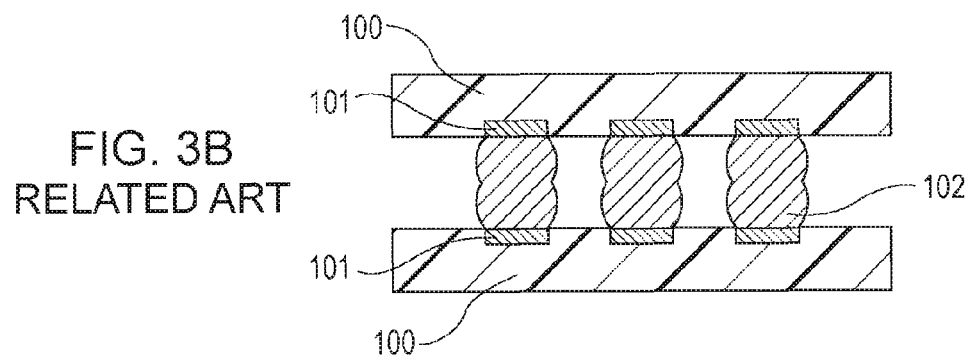
FIG. 3B is a schematic diagram for describing the bonding method known in the art (second process)
Figure 3C:
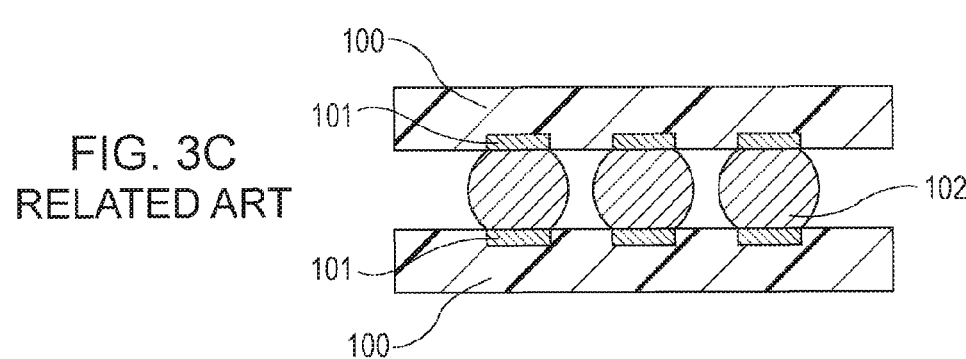
FIG. 3C is a schematic diagram for describing the bonding method known in the art (third process)
Figure 3D:
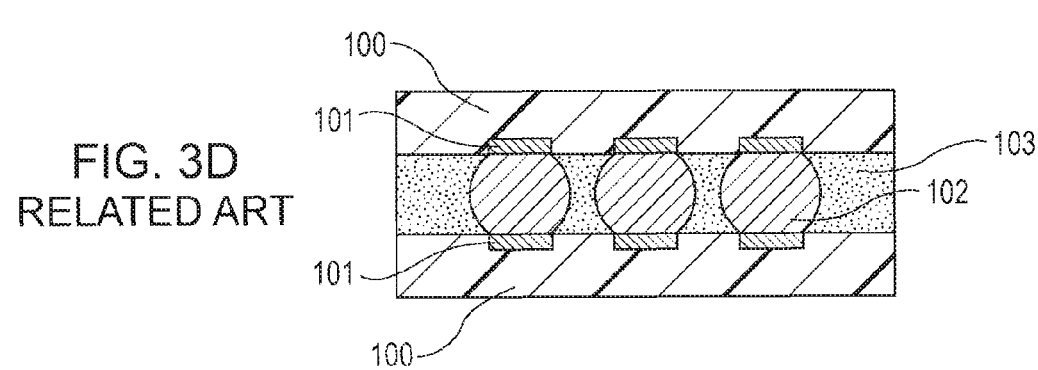
FIG. 3D is a schematic diagram for describing the bonding method known in the art (fourth process).

When the bump-forming pattern is formed from the bump-forming material, the photosensitivity attributed to the photosensitizer is used. At this time, the photosensitizer is decomposed to produce a decomposition residue, and the decomposition residue is present in the porous film. Examples of the semiconductor device include a sensor. Examples of the sensor include a gyro sensor, an acceleration sensor, a pressure sensor, and a weight sensor. The method for producing a semiconductor device will be described by using the drawings. FIG. 2A to FIG. 2D are schematic diagrams for describing the method for producing a semiconductor device. First, a substrate 1 having bumps 3 is prepared in the same manner as in FIG. 1A to FIG. 1D (FIG. 2A). Next, two substrates 1 are disposed such that the bumps 3 on one substrate 1 faces the corresponding bumps 3 on the other substrate 1 (FIG. 2B), followed by pressing (FIG. 2C). Next, many pores are formed in bump-forming patterns 2A by performing heating, which leads to expansion of the bump-forming patterns 2A and integration of the bumps 3 to form bonded parts 3A. As a result, the space between two substrates 1 is filled with a porous film 2B and the bonded parts 3A without any gap (FIG. 2D). Because of no gap, a strong bonding is achieved, which provides a highly reliable semiconductor device.

EXAMPLES

Examples of the embodiments will be described below, but the embodiments are not limited to the following Examples. Examples 1 to 4, Comparative Examples 1 to 2. The following substances were provided as a bump-forming material.

<A Base Resin>
A-1 Cresol novolac resin (available from Asahi Yukizai Corporation)
A-2 Poly-p-hydroxystyrene (available from Nippon Soda Co., Ltd.)
<B Foaming Agent>
B-1 Polyacrylic acid
B-2 Diphenyliodonium nonafluorobutanesulfonate
<C Photosensitizer>
C-1 6-Diazo-5,6-dihydro-5-oxo-1-naphthalenesulfonic acid
C-2 Bis(cyclohexylsulfonyl)diazomethane
<D Crosslinker>
D-1 Tetra methoxymethyl glycoluril
<E Reducing agent>
E-1 Oxalic acid
<F Solvent>
F-1 Propylene glycol monopropyl ether
F-2 Methyl ethyl ketone A bump-forming material obtained by mixing the substances described above at the composition ratio indicated in Table 1 was applied, by a spin coating method, to a semiconductor substrate (Si substrate) in which electrodes 4 µm×4 µm were arrayed in a matrix at a pitch of 10 µm. The bump-forming material was baked at 120° C. to form a coating film. Unless otherwise stated, the thickness of the coating film in all cases was adjusted to 3 µm by controlling the rotation speed and time.

TABLE 1

| | Base resin | Foaming agent | Photosensitizer | Crosslinker | Reducing agent | Solvent |
|---|---|---|---|---|---|---|
| Comparative Example 1 | A-1 (100) | — | C-1 (10) | — | — | F-1 (500) F-2 (50) |
| Example 1 | A-1 (100) | B-1 (10) | C-1 (10) | — | — | F-1 (500) F-2 (50) |
| Example 2 | A-1 (100) | B-1 (10) | C-1 (10) | — | E-1 (5) | F-1 (500) F-2 (50) |
| Example 3 | A-1 (200) | B-2 (10) | C-1 (10) | — | — | F-1 (500) F-2 (50) |
| Comparative Example 2 | A-2 (100) | — | C-2 (10) | D-1 (8) | — | F-1 (500) F-2 (50) |
| Example 4 | A-2 (100) | B-1 (10) | C-2 (10) | D-1 (8) | — | F-1 (500) F-2 (50) |

The values in parentheses in Table 1 are based on parts by mass.

A pattern was drawn on the substrate having the coating film by using an i-line stepper such that rectangles 5 µm×5 µm were formed in parts on the substrate corresponding to the electrodes. Since the materials of Comparative Example 2 and Example 4 function as a negative resist, a reverse mask was used.

After drawing, baking was performed at 100° C., and developing was performed for 120 seconds by using a 4% aqueous solution of tetramethylammonium hydroxide to form openings 4 µm×4 µm above the electrodes of the semiconductor. After a mixing inhibition treatment was carried out by performing an oxygen plasma ashing treatment on the pattern, openings 5 µm×5 µm were formed above the aforementioned openings by using a lift off resist. Next, indium was vapor-deposited at a thickness of 3.5 µm by using a vacuum deposition device, and the lift off resist was removed with a solvent to provide a bump structure in which the openings were filled with indium (e.g., see FIG. 1D).

Next, the wafer was diced into chips. These chips were pressed against different chips (GaAs substrate) having bumps in the same manner as described above by using a flip chip bonder (e.g., see FIG. 2C). Finally, the structure obtained by pressing was heated in a nitrogen atmosphere at 200° C. for 10 minutes to provide a chip assembly (e.g., see FIG. 2D).

The assembly thus obtained was processed with a converged ion beam, and the cross sections of bonded parts were observed. In the assemblies of Comparative Examples 1 and 2, an approximately 1-µm gap was observed in the bonded parts. In the assemblies of Examples 1 to 4, the bonded parts were observed as being filled with a porous film formed from the bump-forming material without any gap. When a reducing agent was added to the bump-forming material (Example 2), the electrical resistance between the chips was found to be 15% smaller than that in the case where no reducing agent was added (Example 1). Furthermore, a temperature cycling test from −25° C. to 125° C. was performed for 1,000 cycles on the assemblies described above. As a result, the increases in resistance in Comparative Examples 1 and 2 were 80% and 70%, respectively. The increase in resistance in Examples 1 to 4 was as low as 10% or less, which demonstrates the advantageous effects of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A material comprising:
   a base resin;
   a solvent; and
   a foaming agent and a photosensitizer, and/or a substance that serves as a foaming agent and a photosensitizer.

2. The material according to claim 1, wherein the base resin is a phenolic resin, an epoxy resin, an acrylic resin, a melamine resin, a polyurethane resin, a polyimide resin or a silicone resin or any combination thereof.

3. The material according to claim 1, wherein the foaming agent is decomposed or evaporated by performing heating at a temperature of 400° C. or lower or performing irradiation with infrared rays.

4. The material according to claim 1, wherein the foaming agent is a thermally decomposable resin that has a molecular weight of 10 to 100,000.

5. The material according to claim 1, wherein the foaming agent is either an acrylic-based resin or a polystyrene-based resin.

6. The material according to claim 1, wherein an amount of the foaming agent contained is 0.1 parts by mass to 200 parts by mass with respect to 100 parts by mass of the base resin.

7. The material according to claim 1, wherein the solvent contains an alcohol solvent, a chain ester solvent, a cyclic ester solvent, a ketone solvent, a chain ether solvent or a cyclic ether solvent or any combination thereof.

8. The material according to claim 1, further comprising a crosslinker.

9. The material according to claim 8, wherein the crosslinker contains a urea derivative, a melamine derivative or a uril derivative or any combination thereof.

10. The material according to claim 1, further comprising a reducing agent that has a carboxyl group.

11. The material according to claim 10, wherein the reducing agent contains acrylic acid, methacrylic acid, oxalic acid or formic acid or any combination thereof.

12. A method for producing an electronic component, the method comprising:
    forming a pattern that has an opening on a substrate by using a material; and
    forming a bump by filling the opening of the pattern with a bump metal,
    wherein the material contains a base resin and a solvent, and further contains a foaming agent and a photosensitizer, and/or a substance that serves a foaming agent and a photosensitizer.

13. A semiconductor device comprising:
    a first substrate;
    a second substrate configured to be bonded to the first substrate via a bonded part in which two bumps are bonded to each other; and
    a porous film configured to be interposed between the first substrate and the second substrate, the porous film containing a decomposition residue derived from a photosensitizer.

14. The semiconductor device according to claim 13, wherein the semiconductor device is a sensor.

* * * * *